United States Patent
Okada et al.

(10) Patent No.: US 7,936,495 B2
(45) Date of Patent: May 3, 2011

(54) OPTICAL MODULATION DEVICE

(75) Inventors: Norio Okada, Tokyo (JP); Tatsuo Hatta, Tokyo (JP); Atsushi Sugitatsu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 51 days.

(21) Appl. No.: 12/423,129

(22) Filed: Apr. 14, 2009

(65) Prior Publication Data

US 2010/0149616 A1 Jun. 17, 2010

(30) Foreign Application Priority Data

Dec. 16, 2008 (JP) ................................. 2008-319843

(51) Int. Cl.
*G02F 1/03* (2006.01)
(52) U.S. Cl. ...................................................... 359/245
(58) Field of Classification Search .................. 359/237, 359/238, 245, 248, 254, 246, 247; 372/80, 372/81, 33, 38; 257/449, 453, 481
See application file for complete search history.

(56) References Cited

U.S. PATENT DOCUMENTS

| 6,057,954 A * | 5/2000 | Parayanthal et al. ......... 359/248 |
| 7,414,767 B2 * | 8/2008 | Bae et al. ...................... 359/241 |

FOREIGN PATENT DOCUMENTS

| JP | 1-192188 | 8/1989 |
| JP | 11-183858 | 7/1999 |
| JP | 2002-350792 | 12/2002 |
| JP | 2004-39854 | 2/2004 |
| JP | 2005-62855 | 3/2005 |
| WO | WO2005/091056 | 9/2005 |

* cited by examiner

*Primary Examiner* — Ricky L Mack
*Assistant Examiner* — Tuyen Q Tra
(74) *Attorney, Agent, or Firm* — Oblon, Spivak, McClelland, Maier & Neustadt, L.L.P.

(57) ABSTRACT

A semiconductor optical modulation device includes a semiconductor optical modulator, wires, an output side line, an input side line and a resistor. The semiconductor optical modulator is an electroabsorption optical modulator. One of the wires is connected between an electrode of the semiconductor optical modulator and the input side line. The other of the wires is connected between the electrode of the semiconductor optical modulator and the output side line. The resistor is connected in series with the output side line. Impedance of the output side line and impedance of the resistor are different from each other.

6 Claims, 3 Drawing Sheets

OPTICAL MODULATION DEVICE

BACKGROUND OF THE INVENTION

1. Field of the Invention

The present invention relates to an optical modulation device.

2. Background Art

A conventional optical modulator for performing optical modulation on an electrical signal is known as disclosed in JP-A-11-183858. The optical modulator disclosed in JP-A-11-183858 is a traveling wave optical modulator (also called an LN modulator). The optical modulator disclosed in JP-A-11-183858 has an optical waveguide, a signal electrode and a transmitting circuit. The signal electrode is provided near the optical waveguide. The transmitting circuit transmits an electrical signal (specifically, a high frequency voltage) to the signal electrode. A termination resistor is provided on the output side of the signal electrode. In JP-A-11-183858, a characteristic impedance of the signal electrode is set to a value different from a resistance of the termination resistor. A reflected wave generated by the difference between the characteristic impedance and the resistance is used to prevent a reduction in a characteristic of the optical modulation in a high frequency band.

SUMMARY OF THE INVENTION

In recent years, an electroabsorption optical modulator (also called an EA modulator) has been developed and put into practical use. The electroabsorption optical modulator is different in operational principle from the traveling wave optical modulator disclosed in JP-A-11-183858. In the traveling wave optical modulator disclosed in JP-A-11-183858, a voltage is applied to the optical waveguide to change a refractive index of the optical waveguide. The electroabsorption optical modulator performs optical modulation by applying an electric field and thereby changing an absorption edge of a semiconductor.

The optical modulator receives an electrical signal with a group delay. In order to suppress an effect of a group delay generated when the optical modulator is driven, it is preferable to adjust a characteristic of a group delay corresponding to a signal frequency, i.e., a group delay characteristic, to a desired characteristic. However, a method for adjusting the group delay characteristic of the electroabsorption optical modulator has not been developed.

The present invention has been made to solve the above problem. It is, therefore, an object of the present invention to provide an electroabsorption optical modulation device capable of adjusting a group delay characteristic.

According to one aspect of the present invention, an optical modulation device includes an electroabsorption optical modulator, a first signal line, a second signal line, and a resistor. The electroabsorption optical modulator has an electrode and performs optical modulation based on an electrical signal applied to the electrode. The first signal line is connected with the electrode and receives an electrical signal from an external to supply the electrical signal to the electrode. The second signal line is connected with the electrode. The resistor is connected in series with a part of the second signal line and has impedance different from impedance of the second signal line, the part of the second signal line being different from a part of the second signal line that is connected with the electrode.

Other and further objects, features and advantages of the invention will appear more fully from the following description.

DETAILED DESCRIPTION OF THE PREFERRED EMBODIMENTS

First Embodiment

Configuration of Optical Modulator According to First Embodiment

Figure 1:
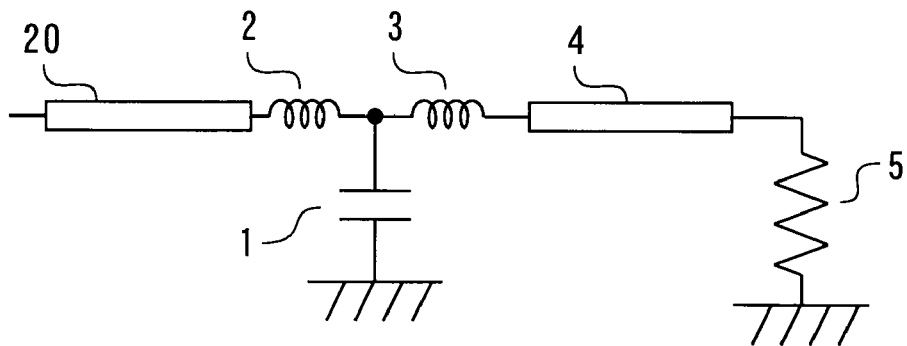
FIG. 1 is a circuit diagram of a semiconductor optical modulation device according to the first embodiment of the present invention.

FIG. 1 is a circuit diagram of a semiconductor optical modulation device according to the first embodiment of the present invention. In FIG. 1, reference numeral 1 denotes the semiconductor optical modulator. The semiconductor optical modulator 1 according to the first embodiment is an electroabsorption optical modulator (also called an EA modulator). The EA modulator performs optical modulation by applying an electric field and thereby changing an absorption edge of a semiconductor. Since an operational principle of the EA modulator and detail configurations of parts of the EA modulator are already known, description thereof are not provided.

Reference numeral 2 denotes a wire connected between an electrode of the semiconductor optical modulator 1 and an input side line 20. Reference numeral 3 denotes a wire connected between the electrode of the semiconductor optical modulator 1 and an output side line 4. Reference numeral 4 denotes the output side line. Reference numeral 5 denotes a resistor connected in series with the output side line 4. Impedance of the output side line 4 and impedance of the resistor 5 are different from each other. In other words, impedance of a connection of the output side line 4 with the resistor 5 mismatches impedance of a connection of the resistor 5 with the output side line 4.

Operation of Optical Modulation Device According to First Embodiment

An operation of the optical modulation device according to the first embodiment is described below with reference to FIG. 2. A wave traveling in the semiconductor optical modulator 1 is represented by Y0. When amplitude of the traveling wave is normalized, the following expression (1) is established. A reflected wave in the semiconductor optical modulator 1 is represented by Y1. When reflectivity in the resistor 5 is represented by ρ, the reflected wave Y1 is represented by the following expression (2).

$$Y0=\sin(\omega t) \qquad (1)$$

$$Y1=\rho \sin(\omega t-\phi) \qquad (2)$$

Figure 2:
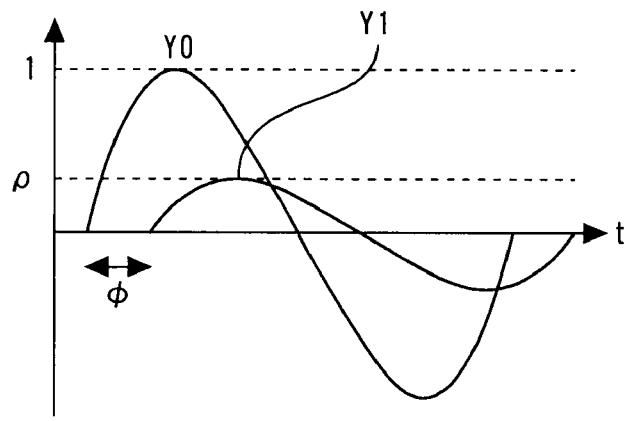
FIG. 2 shows a traveling wave and a reflected wave to explain an operation of the optical modulation device according to the first embodiment.

FIG. 2 shows the relationship between the traveling wave Y0 and the reflected wave Y1.

The reflectivity ρ shown in the expression (2) can be represented by the following expression (3), where Z1 is the impedance of the output side line 4, and R is a resistance of the resistor 5.

$$\rho=-(Z1-R)/(Z1+R) \qquad (3)$$

The symbol φ shown in the expression (2) can be represented by the following expression (4), where L is the length of the output side line 4, f is a frequency, and c' is the speed of a signal in a transmission line (signal line).

$$\phi=L\times(f/c')\times 2\pi \qquad (4)$$

A wave Y2 obtained by combining the traveling wave Y0 and the reflected wave Y1 is represented by the following expression (5).

$$Y2=Y0+Y1=\sin(\omega t)+\rho \sin(\omega t-\phi)=A\times\sin(\omega t+\theta) \qquad (5)$$

The symbol A and a phase θ shown in the expression (5) are represented by the following expressions (6) and (7).

$$A=[\{1+\rho \cos(\phi)\}^2+\{\rho \sin(\phi)\}^2]^{1/2} \qquad (6)$$

$$\tan\theta=-\{\rho \sin(\phi)\}/\{1+\mu \cos(\phi)\} \qquad (7)$$

A group delay characteristic can be represented by differentiating a phase with respect to a frequency. When the group delay characteristic is represented by Gd, the following expression (8) is obtained.

$$Gd=d\theta/df=\tan^{-1}\{\rho \sin(\phi)\}/\{1+\rho \cos(\phi)\} \qquad (8)$$

As understood from the expression (8), the group delay characteristic is a function of the reflectivity ρ in the present embodiment. In addition, as understood from the expression (4), the group delay characteristic is a function of the length (in other words, a distance between the semiconductor optical modulator 1 and the resistor 5) of the output side line 4 in the present embodiment. That is, a desired group delay characteristic can be obtained by setting the reflectivity ρ and the length L of the output side line 4 to appropriate values.

Figure 3:
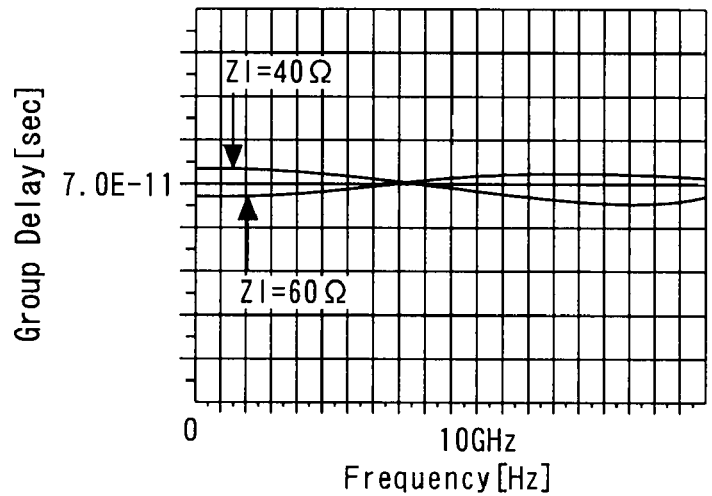
FIG. 3 is a diagram showing simulation results to explain an effect of the first embodiment.

FIG. 3 is a diagram showing simulation results to explain an effect of the first embodiment. The resistance of the termination resistor (resistor 5) is set to 50Ω, the distance between the semiconductor optical modulator 1 and the termination resistor is set to 2.5 mm, and relative permittivity of the line (output side line 4) is set to 3.3 to obtain the simulation results shown in FIG. 3. A group delay characteristic obtained when the impedance of the output side line 4 is 40Ω under the aforementioned conditions and a group delay characteristic obtained when the impedance of the output side line 4 is 60Ω under the aforementioned conditions are shown in FIG. 3.

When the impedance of the output side line is 40Ω, the group delay characteristic in a frequency range from direct current (DC) to 10 GHz has a negative inclination. When the impedance of the output side line is 60Ω, the group delay characteristic in the frequency range from DC to 10 GHz has a positive inclination. According to the first embodiment, the group delay characteristic can be adjusted to a desired characteristic by changing the reflectivity and the length of the output side line 4.

Second Embodiment

In the second embodiment of the present invention, an absolute value of the reflectivity ρ in the semiconductor optical modulation device according to the first embodiment is set to a value equal to or more than 0.05. Since other configurations of the semiconductor optical modulation device according to the second embodiment are the same as those of the semiconductor optical modulation device according to the first embodiment, drawings and description thereof are not provided. Specifically, according to the expression (3), the resistance of the resistor 5 and the impedance of the output side line 4 need to be selected to ensure that the reflectivity ρ is equal to or more than 5%. When the absolute value of the reflectivity ρ is equal to or more than 0.05 (5%), the group delay can be sufficiently changed. It is therefore easy to obtain a desired group delay characteristic.

Third Embodiment

In the third embodiment of the present invention, an electrical length (effective electrical length) of the output side line for the semiconductor optical modulation device according to the first embodiment is set to a value equal to or less than a quarter of a wavelength corresponding to an operational frequency (bit rate frequency) of the semiconductor optical modulation device. Since other configurations of an optical modulation device according to the third embodiment are the same as those of the optical modulation device according to the first embodiment, drawings and description thereof are not provided.

Figure 4:
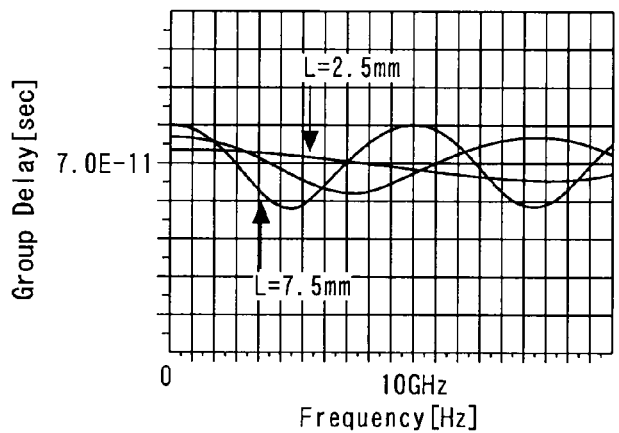
FIG. 4 is a diagram to explain an effect of the third embodiment.

FIG. 4 is a diagram showing simulation results of a group delay characteristic obtained when relative permittivity of the output side line is set to 3.3 and the length of the output side line varies. Since the group delay characteristic can be represented by a trigonometric function, the group delay characteristic has a periodical characteristic with respect to the frequency. Therefore, the group delay characteristic in a specified frequency range has both a negative inclination and a positive inclination. Specifically, when the length of the output side line is 7.5 mm, the group delay characteristic in a frequency range from DC to 10 GHz has a negative inclination and a positive inclination. In this case, when the optical modulation device operates with a frequency of 10 GHz or more, an effect of compensation is lost.

In the third embodiment, the effective electrical length of the output side line is set to a value equal to or less than the quarter of the wavelength corresponding to the operational frequency. This setting makes it possible to obtain an effect of the compensation and adjust the group delay characteristic to a desired characteristic.

Fourth Embodiment

Figure 5:
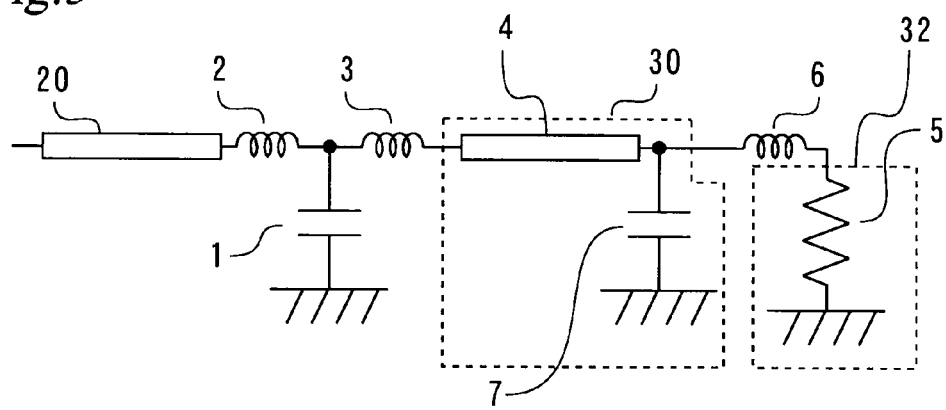
FIG. 5 is a circuit diagram showing a semiconductor optical modulation device according to the fourth embodiment of the present invention.

FIG. 5 is a circuit diagram showing a semiconductor optical modulation device according to the fourth embodiment of the present invention. The configuration of the semiconductor optical modulation device according to the fourth embodiment is the same as the configuration of the semiconductor optical modulation device according to the first embodiment except for the following three points (a) to (c).

(a) The output side line 4 is provided on a substrate 30, and the resistor 5 is provided on a substrate 32 that is different from the substrate 30.

(b) A wire 6 is provided between the output side line 4 and the resistor 5.

(c) A capacitive element 7 is provided. The capacitive element 7 is a capacitance component of an electrode pad provided between the output side line 4 and the resistor 5.

When the resistor 5 and the output side line 4 are provided on the respective substrates different from each other (specifically, when the output side line 4 is provided on the substrate 30 and the resistor 5 is provided on the substrate 32), it is necessary that the resistor 5 and the output side line 4 be connected with each other by means of a wire. Since the wire functions as inductance, the wire causes the reflectivity to be changed. In the fourth embodiment, the capacitive element 7 (capacitance component) is added to the output side line 4 to suppress a change in the reflectivity. This makes it possible to obtain an effect of the combination of the reflected wave and the traveling wave in a similar way to the first embodiment.

Fifth Embodiment

An optical modulation device according to the fifth embodiment has the same configuration as that of the optical modulation device shown in FIG. 5 according to the fourth embodiment. In the fifth embodiment, however, a resistance R of the resistor 5 can be represented by the following expression (9) where L is inductance of the wire 6, and C is a capacity of the capacitive element 7.

$$R = (L/C)^{0.5} \quad (9)$$

In the fifth embodiment, the wire 6 and the capacitive element 7 are selected to meet the relationship of the expression (9). When the relationship between the inductance L and the capacity C is established by the expression of $R = (L/C)^{0.5}$, synthetic impedance is equal to the resistance R. Therefore, when the resistance of the resistor 5 is specified in the same way as the first embodiment, the same effect as the first embodiment can be obtained in the fifth embodiment.

Sixth Embodiment

Figure 6:
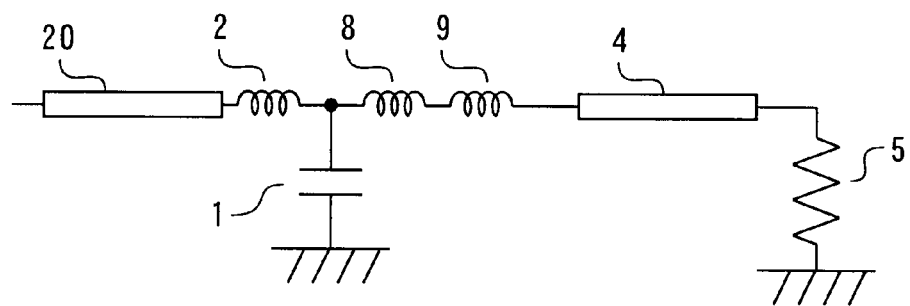
FIG. 6 is a circuit diagram showing an optical modulation device according to the sixth embodiment of the present invention.
Figure 7:
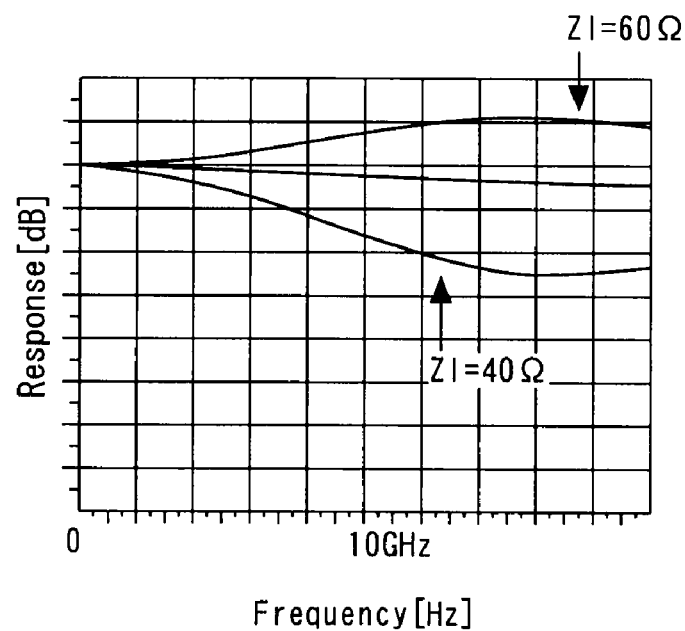
FIG. 7 is a diagram to explain an effect of an optical modulation device according to the seventh embodiment of the present invention.

FIG. 6 is a circuit diagram showing a semiconductor optical modulation device according to the sixth embodiment of the present invention. In FIG. 6, reference numeral 8 denotes a wire connected with the electrode of the semiconductor optical modulator 1. Reference numeral 9 denotes an inductor element connected with the wire 8 and the output side line 4. A reduction of a slope of the group delay characteristic results in a reduction of a gain, as shown in FIG. 7. In the sixth embodiment, the inductor element 9 is provided between the semiconductor optical modulator 1 and the output side line 4. An inductance component of the inductor element 9 can suppress the reduction in the gain.

The optical modulation device according to each of the embodiments of the present invention can enjoy benefits of a reduction in the amount of use of energy and benefits of an improvement of productivity due to the fact that the group delay characteristic can be adjusted to a desired characteristic. The optical modulation device according to the present embodiment contributes to a reduction in an environmental load.

The features and advantages of the present invention may be summarized as follows:

According to one aspect of the present invention, the group delay characteristic can be adjusted to a desired characteristic. Specifically, reflectivity in the second signal line varies based on impedance of the resistive element. The optical modulator is operated by means of a wave obtained by combining a wave reflected from the resistive element to the second signal line and a wave traveling from the first signal line. Under the operational condition, the group delay characteristic is a function of the reflectivity. The optical modulation device having a desired group delay characteristic can be realized by setting the impedance of the resistive element to a value different from impedance of the second signal line.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-319843, filed on Dec. 16, 2008 including specification, claims, drawings and summary, on which the Convention priority of the present application is based, are incorporated herein by reference in its entirety.

What is claimed is:

1. An optical modulation device comprising:
   an electroabsorption optical modulator that has an electrode and performs optical modulation based on an electrical signal applied to the electrode;
   a first signal line that is connected with the electrode and receives an electrical signal from an external to supply the electrical signal to the electrode;
   a second signal line that is connected with the electrode; and
   a resistor that is connected in series with a part of the second signal line different from a part of the second signal line that is connected with the electrode, the resistor having an impedance different from an impedance of the second signal line.

2. The optical modulation device according to claim 1, wherein
   the impedance of the second signal line and the impedance of the resistor are different from each other to ensure that reflectivity in the resistor is equal to or larger than 5%.

3. The optical modulation device according to claim 1, wherein
   an electrical length between the optical modulator and the resistor is equal to or less than a quarter of a wavelength corresponding to a bit rate frequency.

4. The optical modulation device according to claim 1, further comprising:
   a wire that connects the second signal line and the resistor; and
   a capacitive element that is connected in parallel with the wire, wherein
   the second signal line is provided on a first substrate, and the resistor is provided on a second substrate different from the first substrate.

5. The optical modulation device according to claim 4, wherein
   an expression of $R = (L/C)0.5$ is satisfied, where L is inductance of the wire, C is a capacity of the capacitive element, and R is a resistance of the resistor.

6. The optical modulation device according to claim 1, further comprising:
   an inductor element that is connected in series with a wire provided between the electrode of the optical modulator and the second signal line, wherein
   the electrode of the optical modulator and the second signal line are connected with each other by means of the wire.

* * * * *